(12) United States Patent
Dalgic

(10) Patent No.: US 10,470,338 B2
(45) Date of Patent: Nov. 5, 2019

(54) COOLING SYSTEM

(71) Applicant: ASELSAN ELEKTRONIK SANAYI VE TICARET ANONIM SIRKETI, Ankara (TR)

(72) Inventor: Ali Murtaza Dalgic, Ankara (TR)

(73) Assignee: ASELSAN ELEKTRONIK SANAYI VE TICARET ANONIM SIRKETI, Ankara (TR)

( * ) Notice: Subject to any disclaimer, the term of this patent is extended or adjusted under 35 U.S.C. 154(b) by 0 days.

(21) Appl. No.: 16/098,880

(22) PCT Filed: Jan. 10, 2017

(86) PCT No.: PCT/TR2017/050009
§ 371 (c)(1),
(2) Date: Nov. 5, 2018

(87) PCT Pub. No.: WO2018/132079
PCT Pub. Date: Jul. 19, 2018

(65) Prior Publication Data
US 2019/0141856 A1 May 9, 2019

(51) Int. Cl.
| H05K 7/20 | (2006.01) |
| H05K 5/04 | (2006.01) |
| H05K 7/14 | (2006.01) |
| H05K 5/03 | (2006.01) |
| H05K 5/02 | (2006.01) |

(52) U.S. Cl.
CPC .......... H05K 7/20445 (2013.01); H05K 5/03 (2013.01); H05K 5/04 (2013.01); H05K 7/1427 (2013.01); H05K 7/20509 (2013.01)

(58) Field of Classification Search
CPC ............... H05K 7/1404; H05K 7/1427; H05K 7/20154; H05K 7/20418; H05K 7/20445; H05K 7/20409; H05K 7/20509; H05K 7/20545; H05K 7/20436; H05K 7/209; H05K 5/03–04; H01L 23/3675; H01L 23/367; G06F 1/20; G06F 1/181
USPC ................................ 361/702–704, 707, 720
See application file for complete search history.

(56) References Cited

U.S. PATENT DOCUMENTS

| 5,859,764 | A * | 1/1999 | Davis ................... H05K 7/1404 165/80.3 |
| 6,212,075 | B1 * | 4/2001 | Habing ............. H05K 7/20545 257/727 |
| 7,508,670 | B1 * | 3/2009 | Thorson ............. H05K 7/20636 165/104.33 |
| 9,826,662 | B2 * | 11/2017 | Kim ........................ F28F 21/08 |

(Continued)

FOREIGN PATENT DOCUMENTS

EP 2061296 A1 5/2009

Primary Examiner — Dion Ferguson
Assistant Examiner — Amir A Jalali
(74) Attorney, Agent, or Firm — Gokalp Bayramoglu

(57) ABSTRACT

A cooling system for cooling circuit boards. The cooling system includes a casing, which includes at least two board slots and at least one cooling plate between the two board slots; at least one cover, which is placed on a circuit board to be secured to one of the board slots; and at least one wedge placed on the cover. The wedge provides thermal conductivity between the circuit board and the cooling plate when the circuit board is placed into the board slot; and at least one wedgelock that secures the circuit board to the board slot.

10 Claims, 3 Drawing Sheets

(56) References Cited

U.S. PATENT DOCUMENTS

| | | | |
|---|---|---|---|
| 9,913,411 B2* | 3/2018 | De Bock | H05K 7/20336 |
| 2008/0019102 A1* | 1/2008 | Yurko | H05K 7/1404 |
| | | | 361/719 |
| 2011/0058335 A1* | 3/2011 | Sullivan | H05K 7/1404 |
| | | | 361/704 |
| 2011/0267776 A1* | 11/2011 | Porreca | H05K 7/1404 |
| | | | 361/694 |
| 2012/0170224 A1* | 7/2012 | Fowler | H05K 7/1424 |
| | | | 361/720 |
| 2014/0198457 A1* | 7/2014 | Wong | H05K 7/20545 |
| | | | 361/721 |
| 2014/0362531 A1 | 12/2014 | Lee et al. | |
| 2015/0114692 A1 | 4/2015 | Tissot et al. | |
| 2015/0181763 A1* | 6/2015 | de Bock | B23P 15/26 |
| | | | 361/689 |
| 2015/0237763 A1* | 8/2015 | Stutzman | H05K 7/2039 |
| | | | 361/708 |
| 2015/0289413 A1* | 10/2015 | Rush | H05K 7/20672 |
| | | | 361/700 |
| 2016/0081177 A1* | 3/2016 | Kirk | H05K 7/1404 |
| | | | 174/252 |
| 2017/0064868 A1* | 3/2017 | Rush | H05K 7/20336 |
| 2017/0164517 A1* | 6/2017 | Kim | H05K 7/20672 |
| 2017/0339805 A1* | 11/2017 | Lassini | H05K 7/2039 |

* cited by examiner

COOLING SYSTEM

CROSS REFERENCE TO RELATED APPLICATIONS

This application is the national phase entry of International Application No. PCT/TR2017/050009, filed on Jan. 10, 2017, the entire contents of which are incorporated herein by reference.

TECHNICAL FIELD

The present invention is related to system for cooling circuit boards such as VPX, VME & custom PCI modules.

BACKGROUND

In the electronic systems, different circuit boards (such as VPX, VME & custom PCI modules) are used for different purposes. During their operations, components of said circuit boards generate heat. In order to provide stable operation, heat generated by the components of circuit boards needed to be radiated. Otherwise, increasing heat may damage said components or reduce their performance.

In the known art, different methods are used for cooling the electrical components. Said methods are usually divided into two groups, namely active cooling and passive cooling. In active cooling, air is blown on the electrical components (for example using fans). Then, heat of said component is transferred to the blown air. Although active cooling systems provide good cooling, they are generally noisy and require high volume.

In passive cooling systems, heats of the components to be cooled are transferred to heat sinks. Said heat sinks have large surface area in order to dissipate the heat. As compared to the active cooling systems, passive cooling systems require less volume and they operate more silently. Therefore, in order to cool the circuit boards, generally passive cooling systems are preferred.

U.S. Pat. No. 5,859,764A discloses an electronics package employing a high thermal performance wedgelock. According to said document, a circuit card is placed to a slot. In order to secure the circuit card, a wedgelock is used. Said wedgelock is able to dissipate the heat of the circuit cart through the slot. However, in this document, wedgelock dissipates heat of the circuit card only from the edge of the card. Therefore, cooling performance of the system is not satisfying.

SUMMARY

In the present invention, a cooling system for cooling the circuit boards, such as VPX, VME or custom PCI modules, is provided. Said cooling system comprises a casing, which comprises at least two board slots and at least one cooling plate between said two board slots; at least one cover, which is placed on a circuit board to be secured to one of said board slots; at least one wedge placed on said cover, wherein said wedge provides thermal conductivity between the circuit board and cooling plate when said circuit board is placed into said board slot; and at least one wedgelock that secures circuit board to the board slot.

In the cooling system of the present invention, thanks to the cooling plate and wedge, heat of the circuit board is transferred to the casing through a high surface. Therefore, a high cooling performance is achieved.

Object of the Invention

The main object of the invention is to provide a cooling system for cooling circuit boards such as VPX, VME & custom PCI modules.

Another object of the present invention is to provide a cooling system that dissipates the heat of circuit boards through the casing.

Another object of the present invention is to provide a cooling system with high cooling performance.

| | |
|---|---|
| Circuit board | (B) |
| Casing | (C) |
| Board slot | (1) |
| Cooling plate | (2) |
| Cover | (3) |
| Wedge slot | (3a) |
| Wedge | (4) |
| Wedgelock | (5) |
| Connection element | (6) |

DETAILED DESCRIPTION OF THE EMBODIMENTS

Circuit boards, such as VPX, VME and custom PCI modules, comprise plurality of components that generate heat during its operation. In order to provide stable operation, said components needed to be cooled. Therefore, present application provides a cooling system for cooling the circuit boards.

Figure 1:
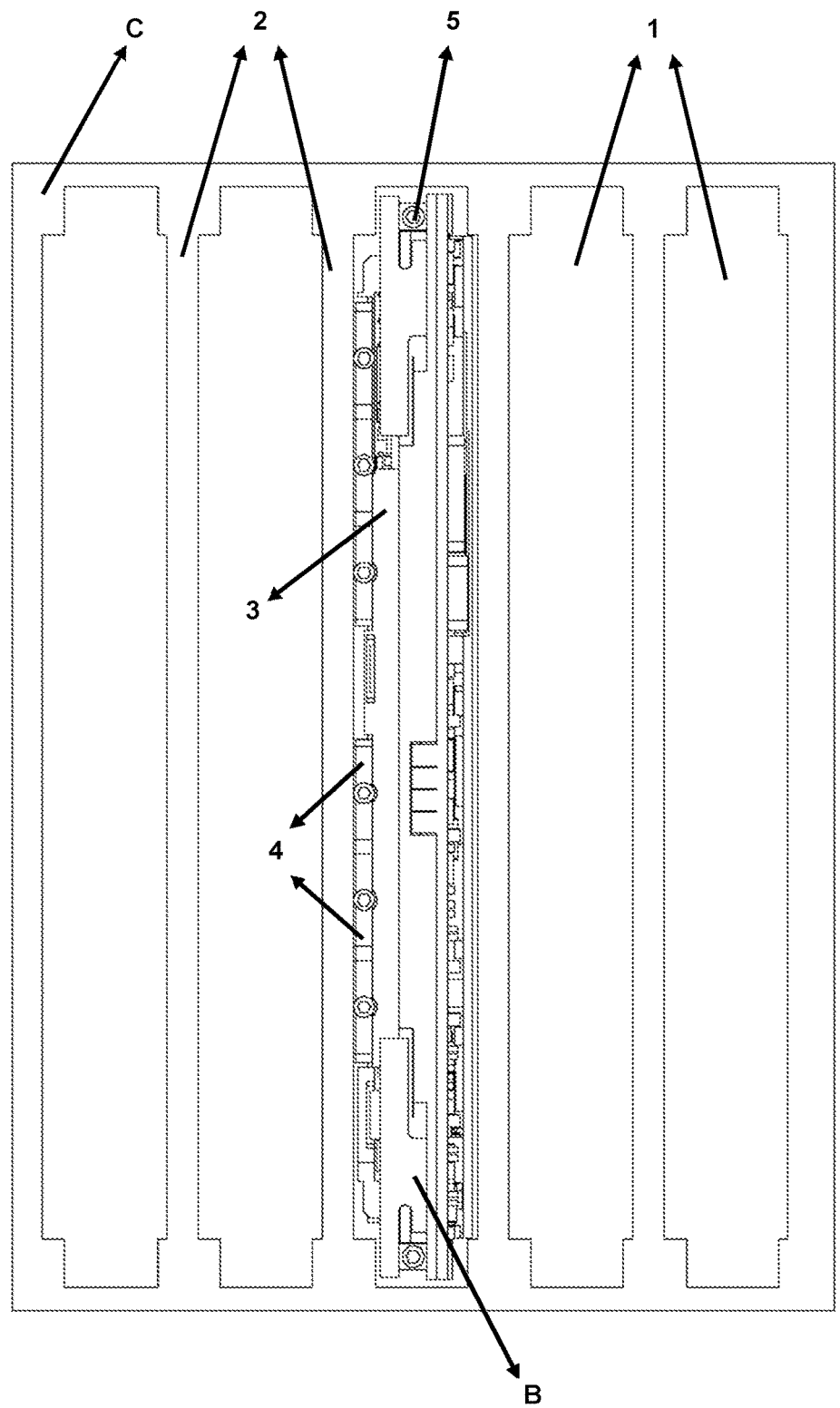
FIG. 1 shows a front view of the cooling system of the present application.
Figure 2:
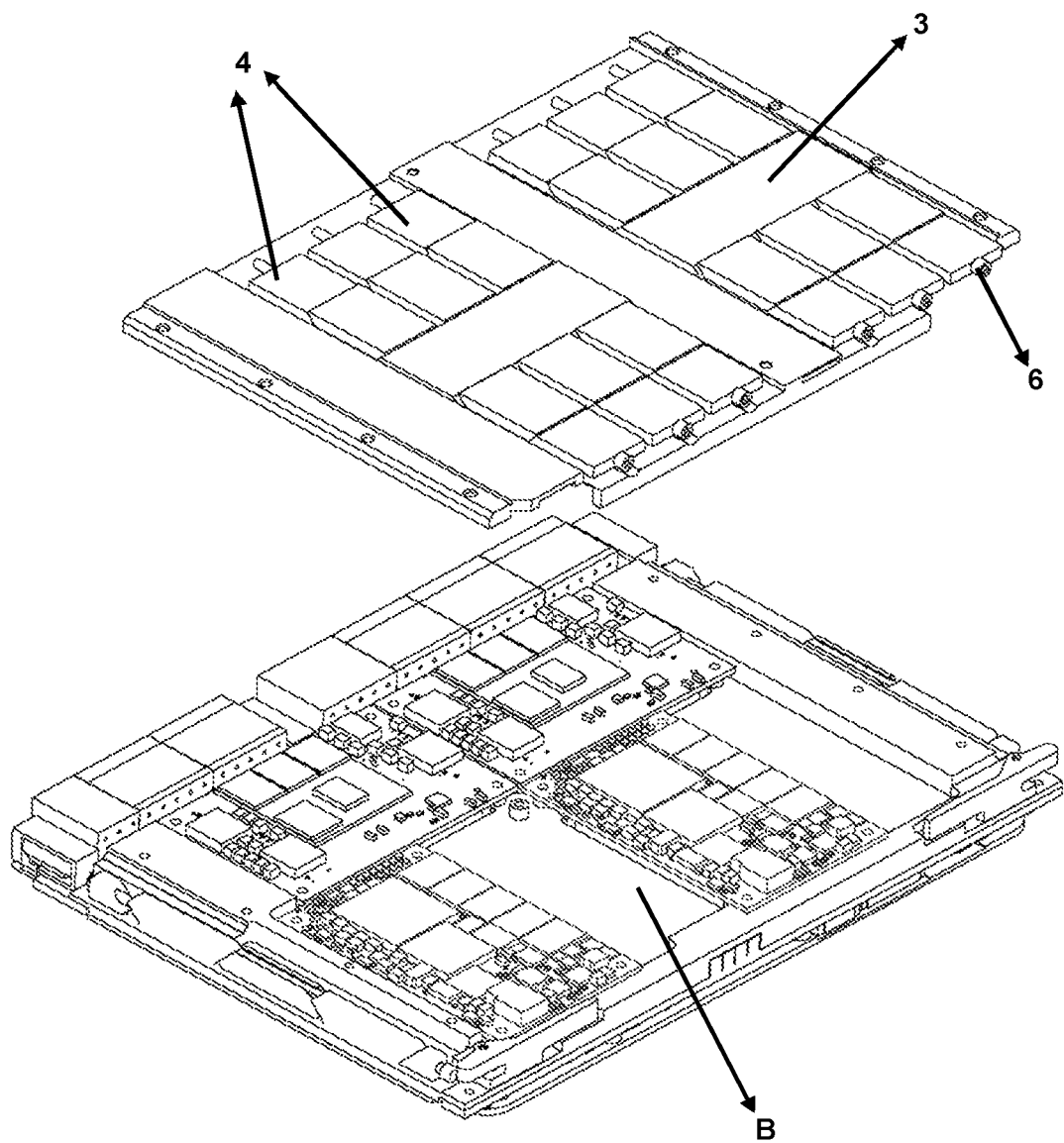
FIG. 2 shows a perspective view of the cooling system of the present application.
Figure 3:
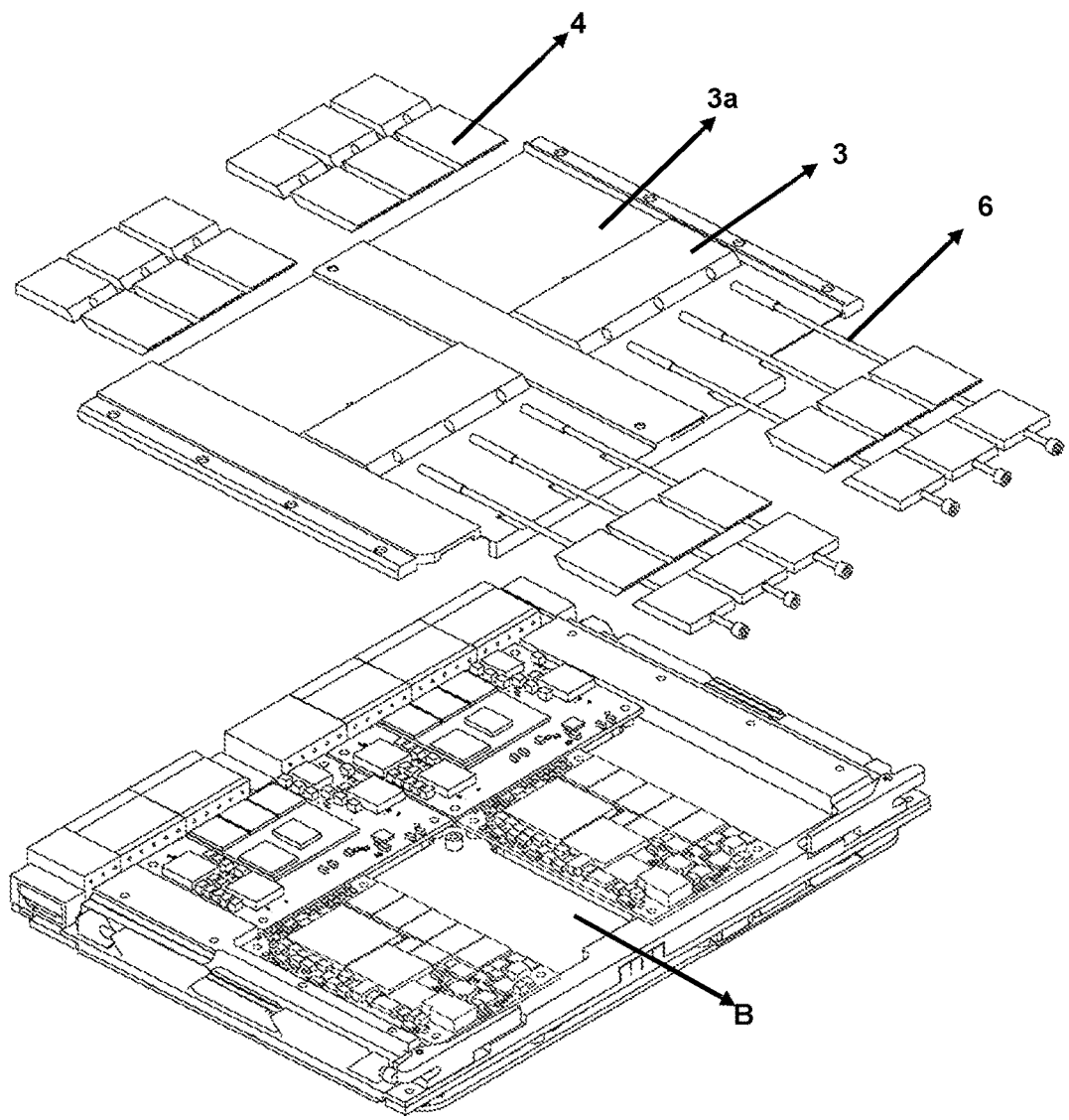
FIG. 3 shows another perspective view of the cooling system of the present application.

Cooling system of the present invention, an exemplary embodiment of which is given in FIGS. 1-3, comprises a casing (C), which is preferably in the form of a metal such as aluminium or steel, which comprises at least two board slots (1), and which comprises at least one cooling plate (2) between said two board slots (1); at least one cover (3), which is placed on a circuit board (B) to be secured to one of said board slots (1); at least one wedge (4) placed on said cover (3), wherein said wedge (4) provides thermal conductivity between the circuit board (B) and cooling plate (2) when said circuit board (B) is placed into the board slot (1); and at least one wedgelock (5) that secures circuit board (B) to the board slot (1).

According to the cooling system of the present invention, heat generated by the components of the circuit board (B) is transferred to the cooling plate (2) through the wedge (4). Then, said heat is dissipated through the body of the casing (C). Thanks to the cooling plate (2) and wedge (4) of the present invention, heat transfer between the circuit board (B) and casing (C) is high. Therefore, cooling system of the present invention has high cooling performance.

In a preferred embodiment of the present invention, said wedge (4) is in the form of a metal, such as aluminium copper or steel. In addition, said cover (3) is also in the form of a metal, such as aluminium, copper or steel. Thus, a high thermal conductivity is provided between the circuit board (B) and the cooling plate (2). In order to dissipate the heat coming from the cover (3) and wedge (4), casing (C) is preferably in the form of a metal (such as aluminium, copper or steel) as well.

In another preferred embodiment of the present invention, cooling system comprises a plurality of wedges (4). In this embodiment, said cover (3) comprises wedge slots (3a), into which said wedges (4) are placed. According to this embodiment, wedges (4) are able to be placed onto electrical components of the circuit board (B), which radiate heat. Therefore, heats of said components are able to be transferred to cooling plate (2) more efficiently. In this embodiment, cooling system preferably comprises at least one connection element (6) that connects said wedges (4) to the cover (3). Said connection element (6) is preferably in the form of stainless steel in order to provide a secure connection.

In another preferred embodiment of the present invention, cooling plate (2) is an integral part of the casing (C) (for example an intermediate wall). In this embodiment, heat transfer between the cooling plate (2) and outer body of the casing (C) is high. In an alternative embodiment, the cooling plate (2) is a removable part of the casing (C) (for example a tray). In this embodiment, although heat transfer between the cooling plate (2) and outer body of the casing (C) is relatively lower, higher mobility is provided.

In the cooling system of the present invention, thanks to the cooling plate (2) and wedge (4), heat of the circuit board (B) is transferred to the casing (C) through a high surface. Therefore, a high cooling performance is achieved.

What is claimed is:

1. A cooling system for cooling a circuit board comprising:
    a casing comprising at least two board slots and at least one cooling plate between the at least two board slots;
    at least one cover placed on the circuit board to be secured to one of the at least two board slots; wherein the at least one cover comprises wedge slots;
    a plurality of wedges in each of the wedge slots, wherein the plurality of wedges are between the at least one cover and the at least one cooling plate and provide thermal conductivity between the circuit board and the at least one cooling plate when the circuit board is placed into the one of the at least two board slots; and
    at least one wedgelock, wherein the at least one wedgelock secures the circuit board to the one of the at least two board slots.

2. The cooling system according to claim 1, wherein the casing is in the form of a metal.

3. The cooling system according to claim 1, wherein the plurality of wedges are in the form of a metal.

4. The cooling system according to claim 3, wherein the at least one cover is in the form of a metal.

5. The cooling system according to claim 1, further comprising at least one connection element connecting the plurality of wedges to the at least one cover.

6. The cooling system according to claim 1, wherein the at least one cooling plate is an integral part of the casing.

7. The cooling system according to claim 1, wherein the at least one cooling plate is a removable part of the casing.

8. The cooling system according to claim 7, wherein the casing is in the form of a metal.

9. The cooling system according to claim 2, wherein the plurality of wedges are in the form of a metal.

10. The cooling system according to claim 9, further comprising at least one connection element connecting the plurality of wedges to the at least one cover.

* * * * *